(12) United States Patent
Kim

(10) Patent No.: US 9,798,361 B2
(45) Date of Patent: Oct. 24, 2017

(54) SOLID STATE DRIVE APPARATUS

(71) Applicant: Samsung Electronics Co., Ltd., Suwon-si, Gyeonggi-do (KR)

(72) Inventor: Jung-hoon Kim, Suwon-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 15/130,026

(22) Filed: Apr. 15, 2016

(65) Prior Publication Data
US 2017/0060195 A1 Mar. 2, 2017

(30) Foreign Application Priority Data
Aug. 25, 2015 (KR) .................. 10-2015-0119817

(51) Int. Cl.
*G06F 1/18* (2006.01)
(52) U.S. Cl.
CPC .............. *G06F 1/182* (2013.01); *G06F 1/187* (2013.01)
(58) Field of Classification Search
CPC ...................................................... G06F 1/187
See application file for complete search history.

(56) References Cited

U.S. PATENT DOCUMENTS

| | | | | |
|---|---|---|---|---|
| 4,713,714 A * | 12/1987 | Gatti | ............. | G11B 33/08 248/581 |
| 5,004,207 A * | 4/1991 | Ishikawa | ............. | F16F 15/08 248/632 |
| 5,394,306 A * | 2/1995 | Koenck | ............. | H05K 7/1417 174/544 |
| 5,535,092 A * | 7/1996 | Bang | ............. | G11B 33/121 248/634 |
| 5,583,742 A * | 12/1996 | Noda | ............. | G06F 1/1626 248/632 |
| 6,567,265 B1 * | 5/2003 | Yamamura | ............. | G11B 33/08 206/523 |
| 6,751,092 B1 * | 6/2004 | Ohnishi | ............. | G06F 1/1616 248/560 |
| 6,867,963 B2 * | 3/2005 | Staiano | ............. | G11B 33/142 312/223.2 |
| 7,082,011 B2 | 7/2006 | Nakamura | | |
| 7,130,187 B1 | 10/2006 | Sun | | |
| 7,262,939 B2 | 8/2007 | Hatchett et al. | | |
| 7,301,763 B2 | 11/2007 | Hara | | |

(Continued)

FOREIGN PATENT DOCUMENTS

JP    2012-156465 A    8/2012

*Primary Examiner* — Adrian S Wilson
(74) *Attorney, Agent, or Firm* — Myers Bigel, P.A.

(57) ABSTRACT

Provided is a solid state drive apparatus having improved reliability. The solid state drive apparatus includes: a substrate on which at least one non-volatile memory device is mounted; a main body case in which the substrate is mounted, wherein an accommodating portion is formed at a corner of the main body case; a bumper case mounted in the accommodating portion of the main body case; and an shock-absorbing member connecting the main body case and the bumper case to each other such that a separation distance is provided between the main body case and the bumper case, wherein the main body case and the bumper case form an exterior of the solid state drive apparatus as adjacent portions of the main body case and the bumper case are located on a same plane with the separation distance therebetween.

17 Claims, 15 Drawing Sheets

(56) References Cited

U.S. PATENT DOCUMENTS

| | | | |
|---|---|---|---|
| 7,583,516 B2* | 9/2009 | Lu | H05K 1/0271 361/807 |
| 7,599,195 B2* | 10/2009 | Chen | G06F 1/1613 361/732 |
| 8,411,432 B1* | 4/2013 | Zimlin | G06F 1/1616 361/679.34 |
| 8,427,822 B2 | 4/2013 | Fukuda | |
| 8,432,681 B2* | 4/2013 | Tung-Ke | G11B 33/08 361/679.33 |
| 8,842,426 B2* | 9/2014 | Chou | G06F 1/181 248/635 |
| 8,941,019 B2 | 1/2015 | Iwamoto et al. | |
| 9,099,163 B1* | 8/2015 | Casey | G11B 33/08 |
| 2001/0009498 A1* | 7/2001 | Oross | G06F 1/1616 361/679.26 |
| 2002/0043608 A1* | 4/2002 | Nakata | F16F 1/025 248/560 |
| 2002/0044406 A1* | 4/2002 | Shimoda | G06F 1/1626 361/679.02 |
| 2002/0044416 A1* | 4/2002 | Harmon, III | G11B 33/08 361/679.36 |
| 2005/0002122 A1 | 1/2005 | Ozaki et al. | |
| 2005/0257949 A1* | 11/2005 | Lalouette | G06F 1/187 174/50 |
| 2007/0133121 A1* | 6/2007 | Xu | G11B 33/08 360/97.19 |
| 2008/0037212 A1* | 2/2008 | Wang | G11B 33/08 361/679.33 |
| 2008/0074831 A1* | 3/2008 | Lee | G06F 1/181 361/679.55 |
| 2008/0151421 A1* | 6/2008 | Asakura | F16F 1/44 360/97.13 |
| 2008/0158808 A1* | 7/2008 | Camarena | G06F 1/187 361/679.34 |
| 2010/0033911 A1* | 2/2010 | Chang | H05K 5/0243 361/679.01 |
| 2011/0069444 A1* | 3/2011 | Nakamura | G11B 33/022 361/679.37 |
| 2011/0228455 A1* | 9/2011 | Dong | H04M 1/05 361/679.01 |
| 2014/0063728 A1* | 3/2014 | Iwamoto | G06F 1/1658 361/679.36 |
| 2014/0252786 A1 | 9/2014 | Singhal | |
| 2015/0129452 A1 | 5/2015 | Richardson et al. | |

* cited by examiner

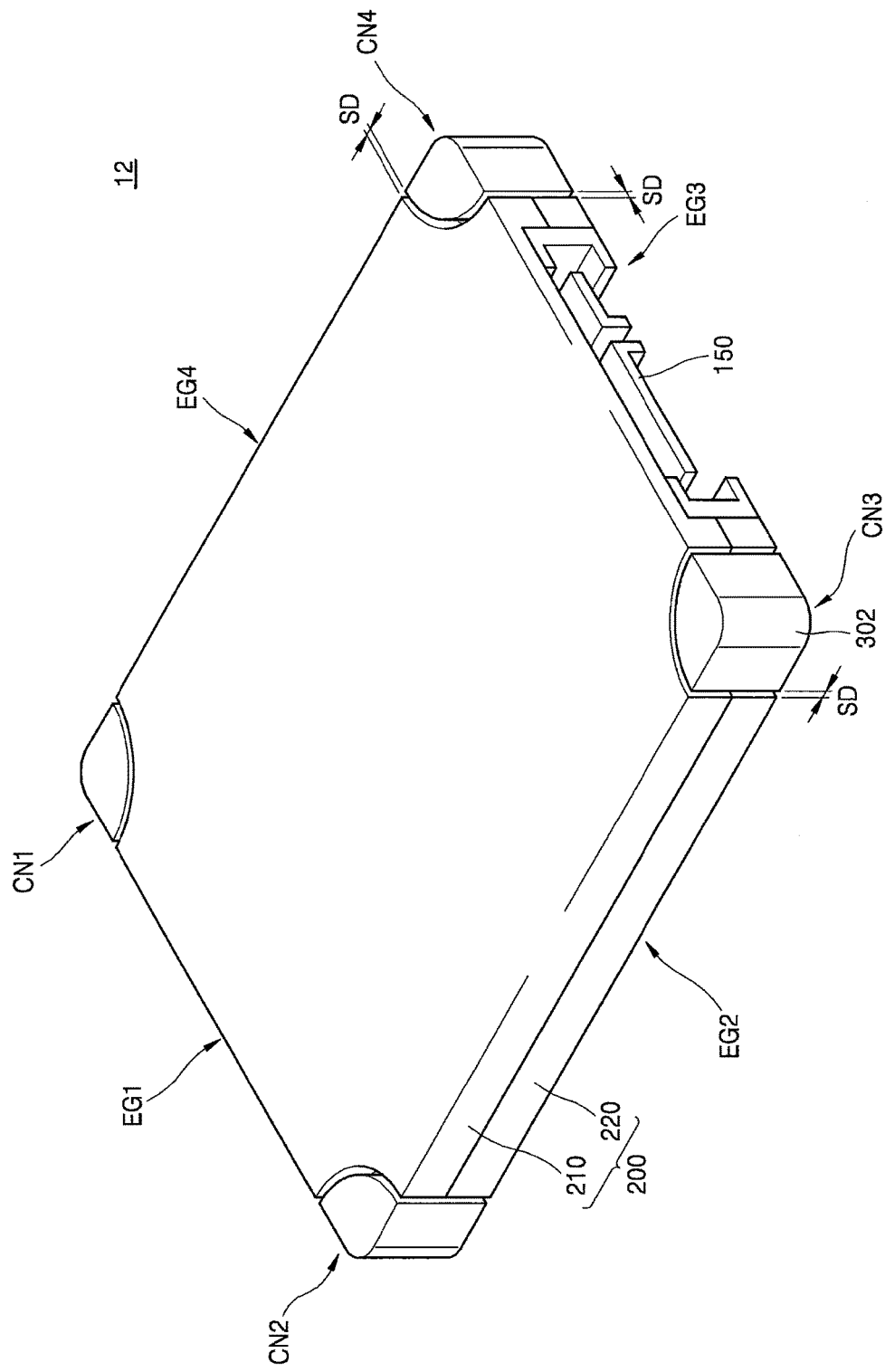

400a 400b
414
412
414

SOLID STATE DRIVE APPARATUS

CROSS-REFERENCE TO RELATED APPLICATION

This application claims the benefit of Korean Patent Application No. 10-2015-0119817, filed on Aug. 25, 2015, in the Korean Intellectual Property Office, the disclosure of which is incorporated herein in its entirety by reference.

BACKGROUND

The inventive concept relates to a solid state drive apparatus, and more particularly, to a solid state drive apparatus having a case accommodating a substrate of the solid state drive apparatus.

A solid state drive apparatus has been highlighted as a next-generation storage apparatus to replace conventional hard disk drives. The solid state drive apparatus is a storage apparatus based on a non-volatile memory, and has characteristics of low power consumption and high storage density. Also, the solid state drive apparatus as a storage device allows fast input and output of large-capacity data, and thus increased demand for the solid state drive apparatus is expected.

However, the solid state drive apparatus is relatively expensive compared to hard disk drives, and thus attention is to be paid when handling, for example, when installing, the same, so that the solid state drive apparatus is not damaged.

SUMMARY

The inventive concept provides a solid state drive apparatus having improved reliability and increased damage protection.

According to an aspect of the inventive concept, there is provided a solid state drive apparatus including a substrate on which at least one non-volatile memory device is mounted, a main body case in which the substrate is mounted, wherein an accommodating portion is formed at a corner of the main body case, bumper case mounted in the accommodating portion of the main body case, and a shock-absorbing member connecting the main body case and the bumper case to each other such that a separation distance is provided between the main body case and the bumper case, wherein the main body case and the bumper case form an exterior of the solid state drive apparatus as adjacent portions of the main body case and the bumper case are located on a same plane with the separation distance therebetween.

The main body case may include an upper case and a lower case respectively having an upper depressed portion and a lower depressed portion depressed from the exterior at each corner of the main body case, wherein the substrate is installed in an internal accommodation space between the upper case and the lower case.

The main body case may include the accommodating portion at each of the upper depressed portion and the lower depressed portion, and the bumper case comprises an upper bumper case mounted in the accommodating portion of the upper case and a lower bumper case mounted in the accommodating portion of the lower case.

The main body case may include the accommodating portion formed over the upper depressed portion and the lower depressed portion corresponding to the main body case, and the bumper case is mounted in the accommodating portion over the upper depressed portion and the lower depressed portion corresponding to the bumper case.

The shock-absorbing member may include at least one of an elastic member, a stopper, a damper, and an elastic spring.

The shock-absorbing member ensures the separation distance may have an allowable value or greater with respect to an impact applied to the bumper case.

The bumper case may be rounded at a corner of the exterior of the solid state drive apparatus.

The bumper case may have a triangular shape, a square shape, an arc shape or an L-shape when viewed from the exterior of the solid state drive apparatus towards a main surface of the substrate.

The main body case may include the accommodation portion over two adjacent corners of the main body case and a side between the two corners.

The bumper case may have a linear shape or a U-shape when viewed from the exterior of the solid state drive apparatus towards a main surface of the substrate.

The main body case and the bumper case may be formed of copper, aluminum, or stainless steel, or a clad metal including at least one of copper, aluminum, and stainless steel.

The at least one non-volatile memory device and the main body case thermally contact each other via a thermal interface material (TIM).

According to another aspect of the inventive concept, there is provided a solid state drive apparatus including a substrate in which at least one non-volatile memory device is mounted, a main body case comprising an accommodation portion at each of four corners, wherein the substrate is accommodated in the main body case, a bumper case mounted in the accommodation portion of the main body case, and a shock-absorbing member connecting the main body case and the bumper case such that a separation distance of an allowable limit or more is provided between the main body case and the bumper case with respect to an impact applied to the bumper case, wherein adjacent portions of the main body case and the bumper case are located on a same plane with the separation distance therebetween to form an exterior of the solid state drive apparatus.

The main body case may include an upper case and a lower case each comprising an accommodation portion at each of four corners, and the substrate is accommodated in an internal accommodation space between the upper case and the lower case.

The upper case and the lower case each may include a depressed portion corresponding to the accommodation portion depressed from the external body, and a portion of the substrate is inserted into a substrate accommodation space having a groove shape, formed between the depressed portions of the upper case and the lower case.

BRIEF DESCRIPTION OF THE DRAWINGS

Exemplary embodiments of the inventive concept will be more clearly understood from the following detailed description taken in conjunction with the accompanying drawings in which:

FIG. 9A is a perspective view of a solid state drive apparatus according to an exemplary embodiment of the inventive concept;

DETAILED DESCRIPTION OF THE EMBODIMENTS

Figure 1A:
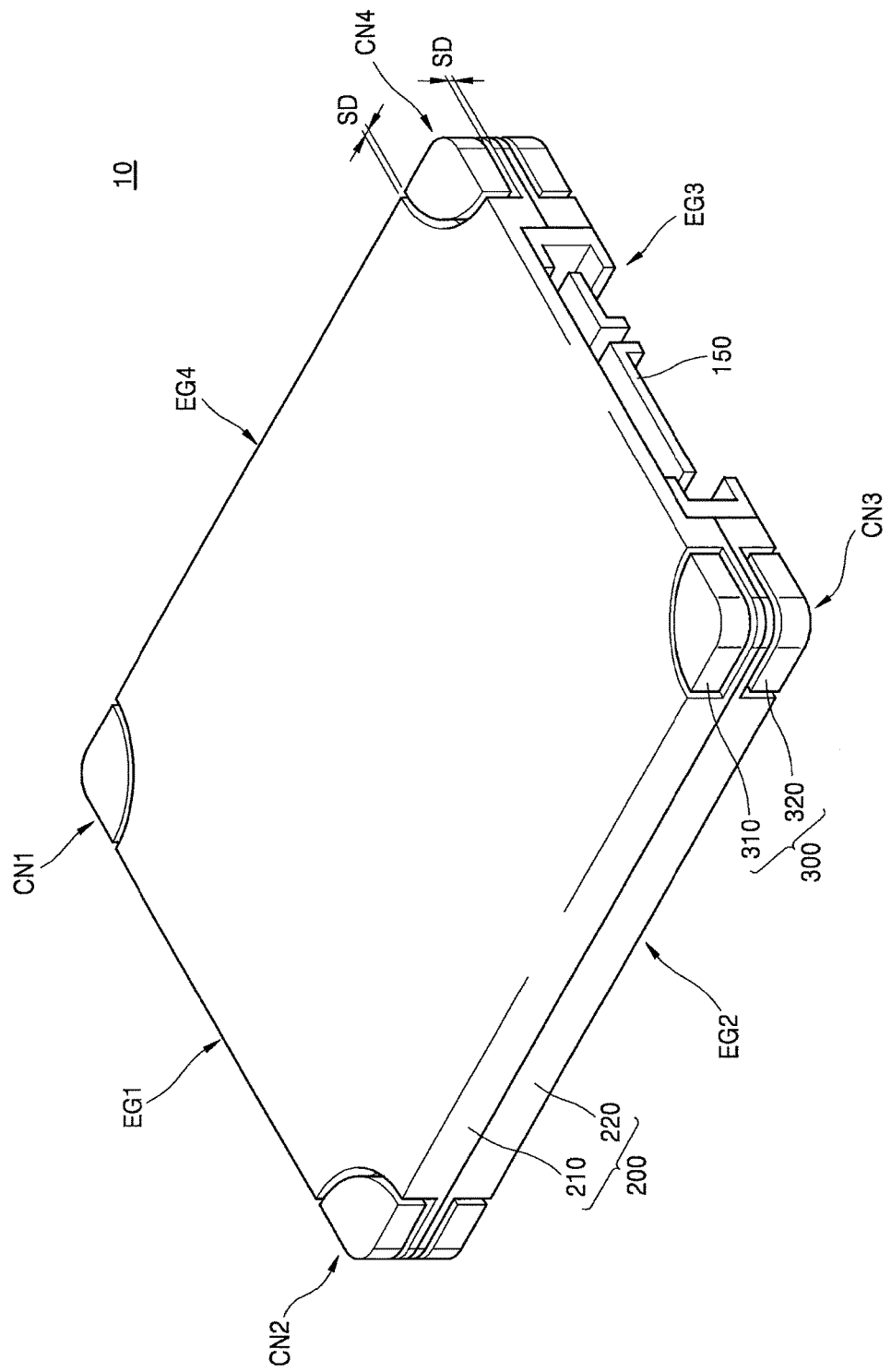
FIG. 1A is a perspective view of a solid state drive apparatus according to an exemplary embodiment of the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the inventive concept to one of ordinary skill in the art. In the drawings, lengths and sizes of components may be exaggerated for convenience of explanation, and a ratio between the sizes of components may be enlarged or reduced.

It will be understood that when a component is referred to as being "on" another component or as "contacting" another component, the component can be directly on or directly contact another component or intervening components may be present. In contrast, when a component is referred to as being "directly on" another component or "directly contacting" another element, there are no intervening components present. Other expressions describing relationships between components, such as, "between" and "directly between", will also be similarly understood.

While such terms as "first", "second", etc., may be used to describe various components, such components should not be limited to the above terms. The above terms are used only to distinguish one component from another. For example, a first component discussed below could be termed a second component, and similarly, a second component may be termed a first component, without departing from the teachings of this disclosure.

An expression used in the singular form encompasses the expression in the plural form, unless it has a clearly different meaning in the context. In the present specification, it is to be understood that the terms such as "including" or "having", etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may added.

As used herein, the term "and/or" includes any and all combinations of one or more of the associated listed items. Expressions such as "at least one of," when preceding a list of elements, modify the entire list of elements and do not modify the individual elements of the list.

A solid state drive apparatus may have a planar shape having a relatively small thickness. Thus, when the corners of a solid state drive apparatus are described in the present specification, it is assumed that there are four corners while ignoring an overall thickness of the solid state drive apparatus having the planar shape. When upper and lower corners are respectively described, then an upper corner and a lower corner of the solid state drive apparatus are assumed to be referred to while considering a thickness of each portion of the solid state drive apparatus corresponding to the upper or lower corner at each of the four corners described while ignoring the overall thickness of the solid state drive apparatus having the planar shape.

In addition, sides of a solid state drive apparatus according to the present specification refer to four sides of the solid state drive apparatus while ignoring the overall thickness of the solid state drive apparatus having the planar shape.

Unless defined differently, all terms used in the description have the same meaning as generally understood by those of ordinary skill in the art.

Hereinafter, the inventive concept will be described more fully with reference to the accompanying drawings, in which exemplary embodiments of the inventive concept are shown.

FIG. 1A is a perspective view of a solid state drive apparatus 10 according to an exemplary embodiment of the inventive concept.

Referring to FIG. 1A, the solid state drive apparatus 10 includes a bumper case 300 mounted at each of corners CN1, CN2, CN3, and CN4 of a main body case 200. The corners CN1, CN2, CN3, and CN4 of the main body case 200 may also be referred to as corners CN1, CN2, CN3, and CN4 of the solid state drive apparatus 10.

The main body case 200 may include an upper case 210 and a lower case 220. The bumper case 300 may include an upper bumper case 310 and a lower bumper case 320 respectively mounted at the upper case 210 and the lower case 220.

The main body case 200 and the bumper case 300 may form an exterior of the solid state drive apparatus 10 as adjacent portions of the main body case 200 and the bumper case 300 are located on the same plane with a separation distance SD between the main body case 200 and the bumper case 300. That is, the main body case 200 and the bumper case 300 may be spaced apart from each other by the separation distance SD in regard to the exterior of the solid state drive apparatus 10.

The main body case 200 may be formed of a single material or may be formed of combination of different materials in consideration of thermal transfer characteristics. The main body case 200 may be formed of a metal, a carbonic material, a polymer material, or a combination of these, but is not limited thereto. The main body case 200 may be formed of, for example, copper, aluminum, stainless steel, or a clad metal including these. Alternatively, the main body case 200 may be formed of a polymer material such as an epoxy resin, polymethylmethacrylate (PMMA), polycarbonate (PC), polyethylene (PE), or polypropylene (PP).

The bumper case 300 may have rounded portions at the corners CN1, CN2, CN3, and CN4 of the exterior of the solid state drive apparatus 10. Each corner portion of the bumper case 300 may have an arc shape when viewed from the exterior of the solid state drive apparatus 10 towards a main surface of a substrate 100. In some exemplary embodiments, the corner portions having the arc shape may have a rounded corner.

The bumper case 300 may be formed of a metal, a carbonic material, a polymer material, or a combination of these, but is not limited thereto. In some exemplary embodiments, the bumper case 300 may be formed of the same material as the main body case 200.

A connector 150 to be connected to an external device to transmit or receive a signal and/or receive power may be disposed one of sides EG1, EG2, EG3, and EG4 of the solid state drive apparatus 10, for example, to the side EG3. A plurality of wiring lines (not shown) may be formed in the connector 150. The connector 150 may be a connector configured to be connected to an external device according to, for example, parallel advanced technology attachment (PATA) standards, serial advanced technology attachment (SATA) standards, small computer small interface (SCSI) standards, or PCI Express (PCIe) standards. The SATA standards include not only SATA-1 but any SATA standards such as SATA-2, SATA-3, or e-SATA (external SATA). The PCIe standards include not only PCIe 1.0 but any PCIe standards such as PCIe 2.0, PCIe 2.1, PCIe 3.0, or PCIe 4.0. The SCSI standards include any SCSI standards such as parallel SCSI standards, serial combination SA-SCSI (SAS) standards, or iSCSI standards.

Figure 1B:
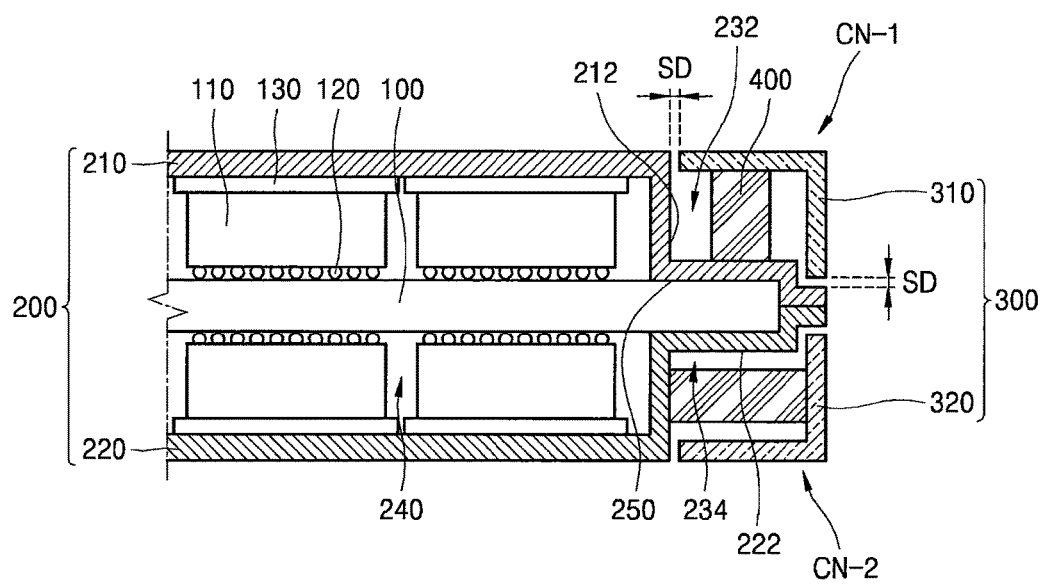
FIG. 1B is a cross-sectional view illustrating major portions of a solid state drive apparatus according to an exemplary embodiment of the inventive concept.

FIG. 1B is a cross-sectional view illustrating major portions of a solid state drive apparatus according to an exemplary embodiment of the inventive concept. In detail, FIG. 1B is a cross-sectional view illustrating major portions of the solid state drive apparatus 10 at one of the corners CN1, CN2, CN3, and CN4 of the solid state drive apparatus 10 of FIG. 1A.

When referring to FIGS. 1A and 1B, the solid state drive apparatus 10 includes the substrate 100, the main body case 200, in which the substrate 100 is mounted, the bumper case 300, and a shock-absorbing member 400.

A plurality of semiconductor chips including at least one non-volatile memory device 110 may be mounted on one or two surfaces of the substrate 100. The plurality of semiconductor chips may include the non-volatile memory device 110, a controller device (not shown), and an auxiliary memory device (not shown).

The substrate 100 may be, for example, a printed circuit board. The substrate 100 may include a substrate base and an upper pad (not shown) and a lower pad (not shown) respectively formed on upper and lower surfaces of the substrate base. The upper pad and the lower pad may be each exposed by a solder resist layer (not shown) covering the upper and lower surfaces of the substrate base. The substrate base may be formed of at least one material selected from a group consisting of a phenolic resin, an epoxy resin, and polyimide. For example, the substrate base may include at least one material selected from a group consisting of Frame retardant 4 (FR4), tetrafunctional epoxy, polyphenylene ether, epoxy/polyphenylene oxide, bismaleimide triazine (BT), thermount, cyanate ester, polyimide, and liquid crystal polymer. The upper pad and the lower pad may be formed of copper, nickel, stainless steel, or beryllium copper. An internal wiring (not shown) that is electrically connected to the upper pad and/or the lower pad may be formed in the substrate base. The upper pad and the lower pad may be portions of circuit wirings formed by coating an upper surface and a lower surface of the substrate base with copper coil and patterning on the upper and lower surfaces of the substrate base to form circuit wirings, and then exposing portions of the circuit wirings via the solder resist layer. The substrate base may include a plurality of base layers, and the substrate 100 may have layers formed to have wirings on the upper and lower surfaces of the substrate base and between the plurality of base layers. That is, the substrate 100 may have a plurality of layers. The substrate 100 may include, for example, wirings such as a circuit wiring or heat-conducting wiring formed in the plurality of layers, and the internal wiring such as a connection wiring connecting the wirings of the plurality of layers.

The non-volatile memory 110 may be, for example, a NAND flash memory, a resistive random access memory (RRAM), a magnetoresistive RAM (MRAM), a phase-change RAM (PRAM), or a ferroelectric RAM (FRAM). The non-volatile memory device 110 may be electrically connected to the substrate 100 via a connection member 120. The connection member 120 may be, for example, a solder ball or a bump. The non-volatile memory device 110 may include a single non-volatile memory chip or a semiconductor package in which a plurality of non-volatile memory chips are stacked.

While only the non-volatile memory device 110 is illustrated for convenience of illustration, the controller device or the auxiliary memory device may also be mounted on one or two surfaces of the substrate 100, like the non-volatile memory device 110, and electrically connected to the substrate 100 via the connection member 120. Alternatively, the auxiliary memory device may be mounted on one or two surfaces of the substrate 100 by using a die attach film (DAF) so as to be electrically connected to the substrate 100 via a bonding wire.

The controller device may provide an interface and a protocol between a host and the non-volatile memory device 110. The controller device may provide standard protocols such as PATA, SATA, SCSI, or PCIe, for interfacing between the non-volatile memory device 110 and the host. Also, the controller device may perform, with respect to the non-volatile memory device 110, wear leveling, garbage collection, bad block management, or error correcting code (ECC) or the like.

The auxiliary memory device may be a non-volatile memory device such as a dynamic RAM (DRAM). The auxiliary memory device may provide cache so as to scale access time and data transfer performance according to process performance of a system in which the solid state drive apparatus 10 is included.

A thermal interface material (TIM) 130 may be formed on the non-volatile memory device 110, the memory controller device, and/or the auxiliary memory device. The non-volatile memory device 110, the controller device, and/or the auxiliary memory device may thermally contact the main body case 200 via the TIM 130. The TIM 130 is a material facilitating transfer of heat generated in the non-volatile memory device 110, the controller device, and/or the auxiliary memory device, to the main body case 200. The TIM 130 may be, for example, grease, a thermoconductive adhesive, mineral oil, a gap filler putty, a gel or a pad formed of a phase change material, or a particle filled epoxy. Examples of commercially available grease are ShinEtsu G750, ShinEtsu G751, ShinEtsu G765, and Berquist TIC-7500; examples of commercially available phase-change material are Thermax HF60110-BT, Chromerics T725, Chromerics T443, Chromerics T454, Thermagon T-pcm 905c, Berquist 200U, Berquist HiFlow 225-U, and Berquist HiFlow 225-UT; and examples of commercially available thermoconductive adhesive are Chromerics therm-A-form T642. However, the TIM 130 is not limited thereto.

Active or passive elements such as a chip resistor, a chip capacitor, inductance, a switch, a temperature sensor, a DC-DC converter, a quartz generating a clock, or a voltage regulator may be further mounted on the substrate 100.

The main body case 200 may include upper and lower accommodating portions 232 and 234 at the corners CN1, CN2, CN3, and CN4. The bumper case 300 may be mounted in the upper and lower accommodating portions 232 and 234 of the main body case 200. The main body case 200 and the bumper case 300 may be connected to each other via the shock-absorbing member 400. The shock-absorbing member 400 may provide a separation distance SD between the main body case 200 and the bumper case 300. The shock-absorbing member 400 may allow the separation distance SD to be an allowable value (a minimum separation distance SD-MIN of FIG. 11) or greater with respect to impact applied to the bumper case 300. For example, the shock-absorbing member 400 may include at least one of an elastic member, a stopper, a damper, and an elastic spring. In detail, the shock-absorbing member 400 may include an elastic member, an elastic spring, a combination of a stopper and an elastic spring, or a combination of a damper and an elastic spring, but is not limited thereto.

The main body case 200 includes upper and lower depressed portions 212 and 222 that are bent from an outer portion of the solid state drive apparatus 10 and have a groove shape. The main body case 200 may include the upper and lower accommodating portions 232 and 234 in which the bumper case 300 may be mounted via the upper and lower depressed portions 212 and 222.

The main body case 200 may include the upper case 210 and the lower case 220. The bumper case 300 may include the upper bumper case 310 and the lower bumper case 320.

The upper case 210 may include the upper depressed portion 212 that is bent from the outer portion of the solid state drive apparatus 10 and has a groove shape, at a corner CN-1. The lower case 220 may include the lower depressed portion 222 that is bent from the outer portion of the solid state drive apparatus 10 and has a groove shape, at a corner CN-2.

The upper case 210 and the lower case 220 may respectively include the upper accommodating portion 232 and the lower accommodating portion 234 in which the upper bumper case 310 and the lower bumper case 320 may be respectively mounted via the upper and lower depressed portions 212 and 222. The upper case 210 and the upper bumper case 310 and the lower case 220 and the lower bumper case 320 may be respectively connected to each other by using the shock-absorbing member 400.

While FIG. 1B illustrates that the shock-absorbing member 400 connected to the upper bumper case 310 is disposed in a vertical direction, and the shock-absorbing member 400 connected to the lower bumper case 320 is disposed in a horizontal direction, this is merely for convenience of illustration, and an arrangement direction of the shock-absorbing member 400 is not limited thereto. The shock-absorbing member 400 may have various arrangement directions such that the separation distance SD may have an allowable value (the minimum separation distance SD-MIN of FIG. 11) or greater with respect to impact applied to the bumper case 300, and also, two or more shock-absorbing members 400 may be connected to one upper bumper case 310 or one lower bumper case 320.

The substrate 100 may be mounted inside the main body case 200. The substrate 100 may be mounted in an internal accommodation space 240 and a substrate accommodation space 250 between the upper case 210 and the lower case 220. A portion of the substrate 100 may be inserted into the substrate accommodation space 250 which is formed between the upper and lower depressed portions 212 and 222 and has a groove shape.

When an impact is applied to the corners CN1, CN2, CN3, and CN4 of the solid state drive apparatus 10 according to the inventive concept due to being dropped or the like, the shock of the impact may be absorbed by the shock-absorbing member 400 that is connected to the bumper case 300 and mounted at the corners CN1, CN2, CN3, and CN4 so that the separation distance SD between the main body case 200 and the bumper case 300 has an allowable value (the minimum separation distance SD-MIN of FIG. 11) or greater. Thus, as the bumper case 300 is spaced apart from the main body case 200 and does not directly contact the main body case 200, impact applied to the bumper case 300 is not transferred to the main body case 200, thereby preventing damages to the substrate 100 mounted in the solid state drive apparatus 10 and the semiconductor chips mounted in the substrate 100, including the non-volatile memory device 110.

In addition, as a portion of the substrate 100 is inserted into the substrate accommodation space 250, the substrate 100 may be stably fixed inside the internal accommodation spaces 240 and the substrate accommodation space 250.

In the present specification, FIG. 1B and the other cross-sectional views provided in the other drawings may not correspond to cross-sections placed on the same plane. For example, the substrate 100, the bumper case 300, and the shock-absorbing member 400 may be located on cross-sections of different planes.

Figure 1C:
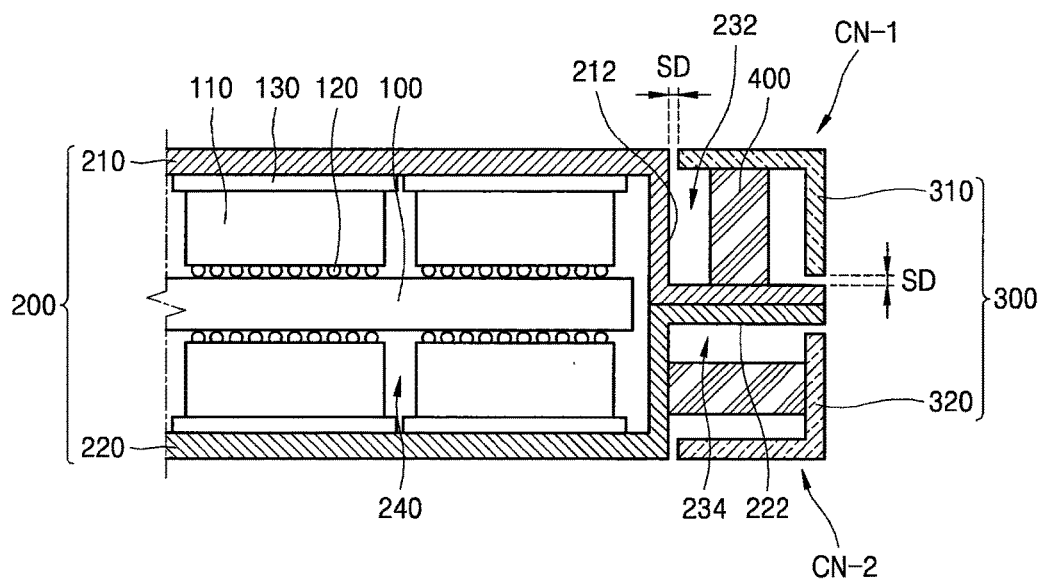
FIG. 1C is a cross-sectional view illustrating major portions of a solid state drive apparatus according to an exemplary embodiment of the inventive concept.

FIG. 1C is a cross-sectional view illustrating major portions of a solid state drive apparatus according to an exemplary embodiment of the inventive concept. In detail, FIG. 1C is a cross-sectional view of major portions of the solid state drive apparatus 10 of FIG. 1A at one of the corners CN1, CN2, CN3, and CN4. Description provided above with reference to FIG. 1B and also applied to the embodiment of FIG. 1C may be omitted below.

When referring to FIGS. 1A and 1C, the solid state drive apparatus 10 includes the substrate 100, the main body case 200, in which the substrate 100 is mounted, the bumper case 300, and the shock-absorbing member 400.

The substrate 100 may be installed in the internal accommodation space 240 between the upper case 210 and the lower case 220. The upper depressed portion 212 and the lower depressed portion 222 may partially contact each other.

According to the solid state drive apparatus 10 of the inventive concept, impact applied to bumper case 300 is not transferred to the main body case 200, and thus, damages to the substrate 100 mounted in the solid state drive apparatus 10 and the semiconductor chips mounted in the substrate 100, including the non-volatile memory device 110, may be prevented.

In addition, as portions of the upper depressed portion 212 and the lower depressed portion 222 contact each other, space between the upper and lower accommodating portions 232 and 234 and bumper case 300 may be increased. Thus, as space for the shock-absorbing member 400 is increased, impact absorbing performance of the shock-absorbing member 400 may be improved.

FIGS. 2 through 8 are perspective views illustrating a solid state drive apparatus according to exemplary embodiments of the inventive concept. Unless specified otherwise, cross-sections of solid state drive apparatuses 10a, 10b, 10c, 10d, 10e, 10f, and 10g illustrated in FIGS. 2 through 8 may be identical to a cross-section of the solid state drive apparatus 10 illustrated in FIGS. 1B and 1C. In regard to descriptions of the exemplary embodiments of FIGS. 2 through 8, the description provided above with reference to FIGS. 1A through 1C may be omitted. In regard to descriptions of exemplary embodiments with reference to FIGS. 3 through 8, the description provided with respect to a previous embodiment may be omitted with respect to each of subsequently described exemplary embodiments.

Figure 2:
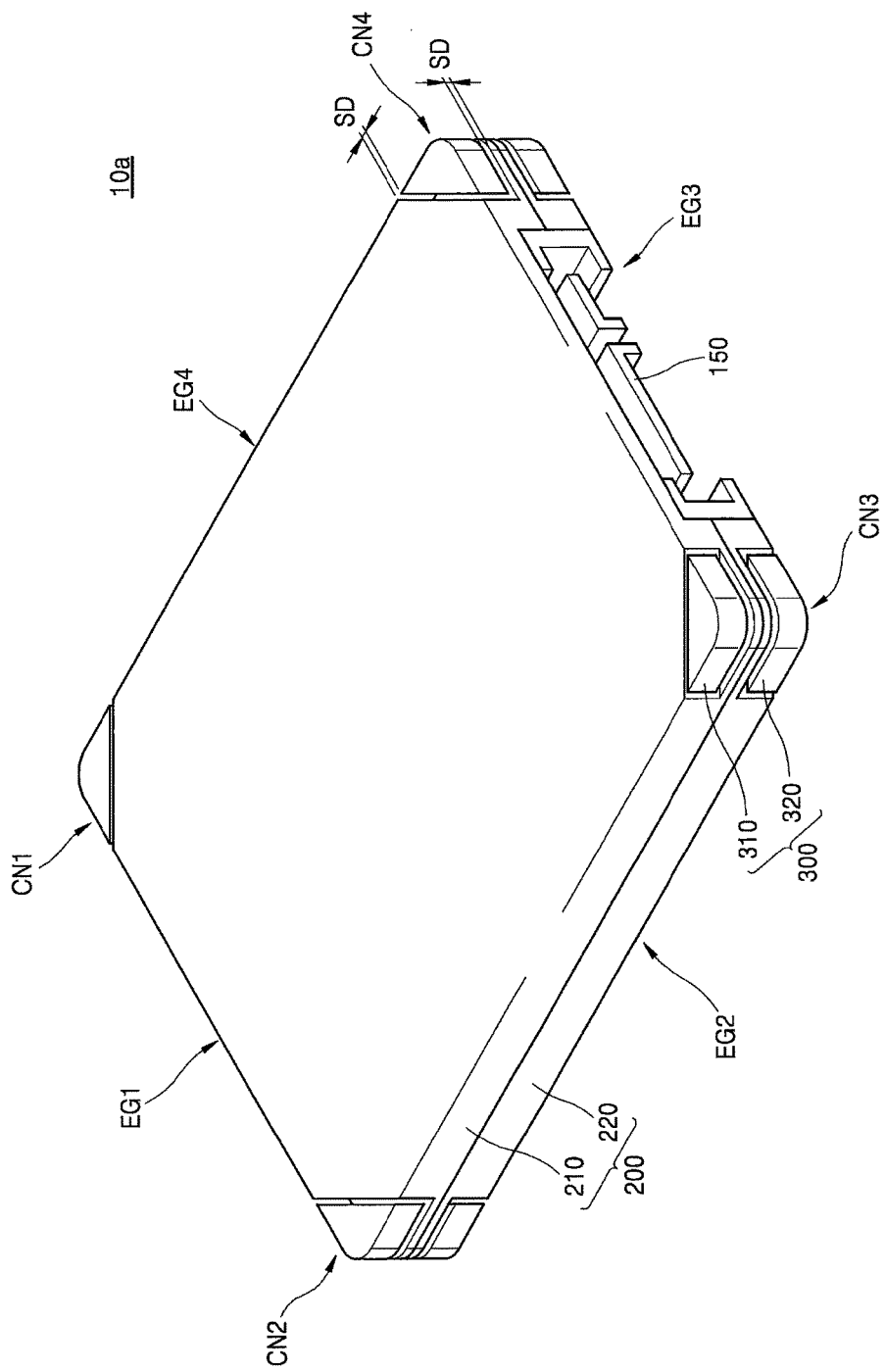
FIGS. 2 through 8 are perspective views illustrating a solid state drive apparatus according to exemplary embodiments of the inventive concept.

Referring to FIG. 2, the solid state drive apparatus 10a includes the bumper case 300 mounted at the corners CN1, CN2, CN3, and CN4 of the main body case 200. Each corner portion of the bumper case 300 may have a triangular shape when viewed from the exterior of the solid state drive apparatus 10a towards a major surface of the substrate 100 (FIG. 1B or FIG. 1C). In some exemplary embodiments, at least one of the triangular corner portions may have a rounded corner.

Figure 3:
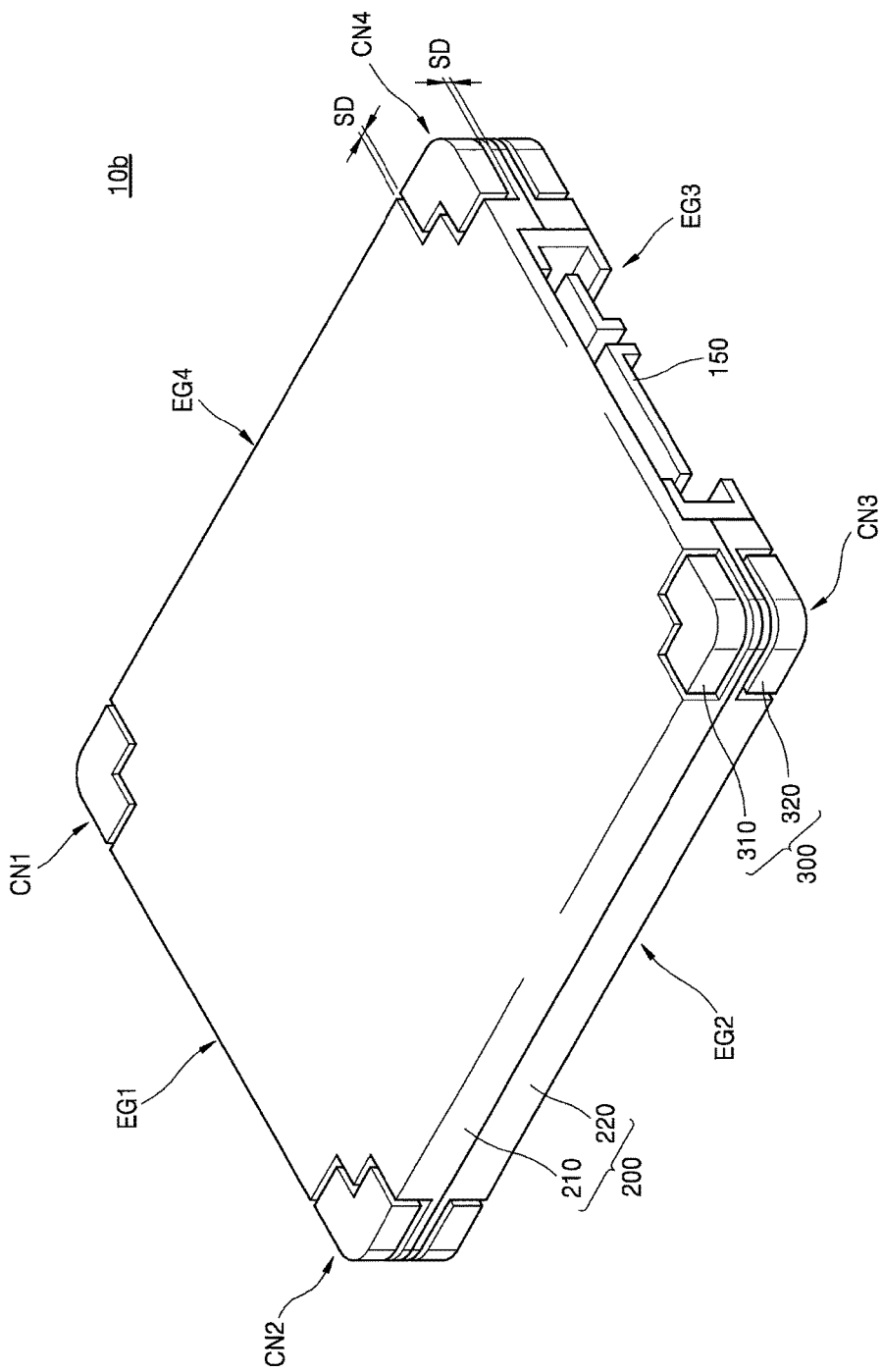

Referring to FIG. 3, the solid state drive apparatus 10b includes the bumper case 300 mounted at the corners CN1, CN2, CN3, and CN4 of the main body case 200. The bumper case 300 may have a L-shape when viewed from the exterior of the solid state drive apparatus 10b towards a major surface of the substrate 100 (FIG. 1B or FIG. 1C). In some exemplary embodiments, at least one of the L-shaped corners may be rounded.

Figure 4:
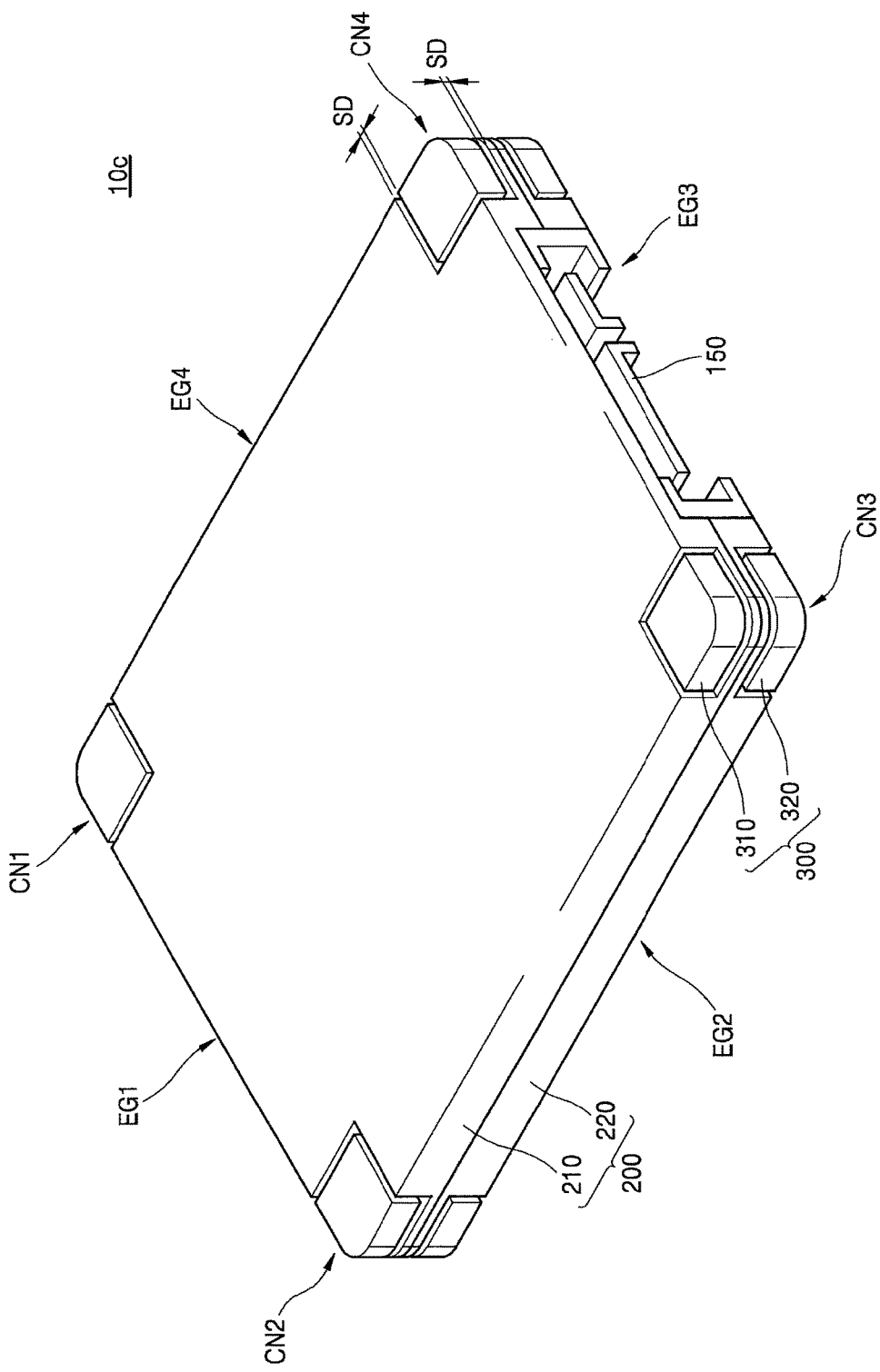

Referring to FIG. 4, the solid state drive apparatus 10c includes the bumper case 300 mounted at the corners CN1, CN2, CN3, and CN4 of the main body case 200. The bumper case 300 may have a square shape when viewed from the exterior of the solid state drive apparatus 10c towards a major surface of the substrate 100 (FIG. 1B or FIG. 1C). In some exemplary embodiments, at least one of the square-shaped corners may be rounded.

Figure 5:
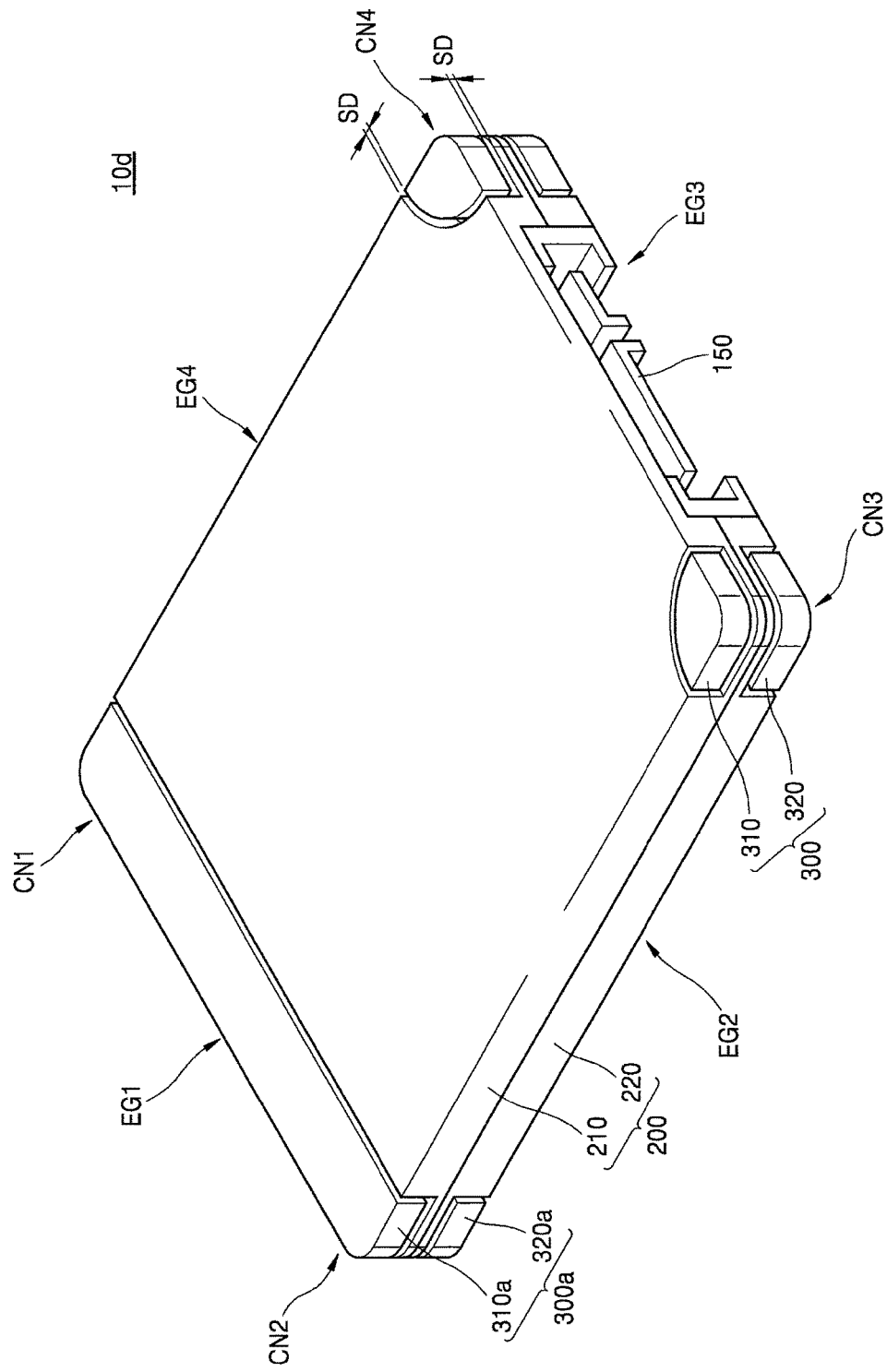

Referring to FIG. 5, the solid state drive apparatus 10d includes a first bumper case 300 mounted at some of the corners CN1, CN2, CN3, and CN4 of the main body case 200, here, at the corners CN3 and CN4, and a second bumper case 300a mounted at at least one of the sides EG1, EG2, EG3, and EG4 of the main body case 200, here, at the side EG1. The first bumper case 300 has the same shape as the bumper cases 300 described above with reference to FIGS. 1A through 4, and thus description thereof will be omitted here. While the first bumper case 300 having an arc shape when viewed from the exterior of the solid state drive apparatus 10d illustrated in FIG. 5 towards a major surface of the substrate 100 (FIG. 1B or FIG. 1C), the first bumper case 300 is not limited thereto, and may also have a triangular shape, an L-shape, or a square shape as shown in FIGS. 2 through 4.

The second bumper case 300a may be mounted over two adjacent corners CN1 and CN2 of the main body case 200 and the side EG1 between the corners CN1 and CN2. Thus, the main body case 200 may have the upper and lower accommodating portions 232 and 234 illustrated in FIG. 1B or FIG. 1C over the two adjacent corners CN1 and CN2 of the main body case 200 and the side EG1 therebetween. The second bumper case 300a may be at the side EG1 opposite to the side EG3 of the main body case 200, at which the connector 150 is disposed.

The second bumper case 300a may include an upper second bumper case 310a and a lower second bumper case 320a respectively mounted in the upper case 210 and the lower case 220. The second bumper case 300a may have a linear (or bar-shaped) shape when viewed from the exterior of the solid state drive apparatus 10d towards a major surface of the substrate 100 (FIG. 1B or FIG. 1C).

Figure 6:
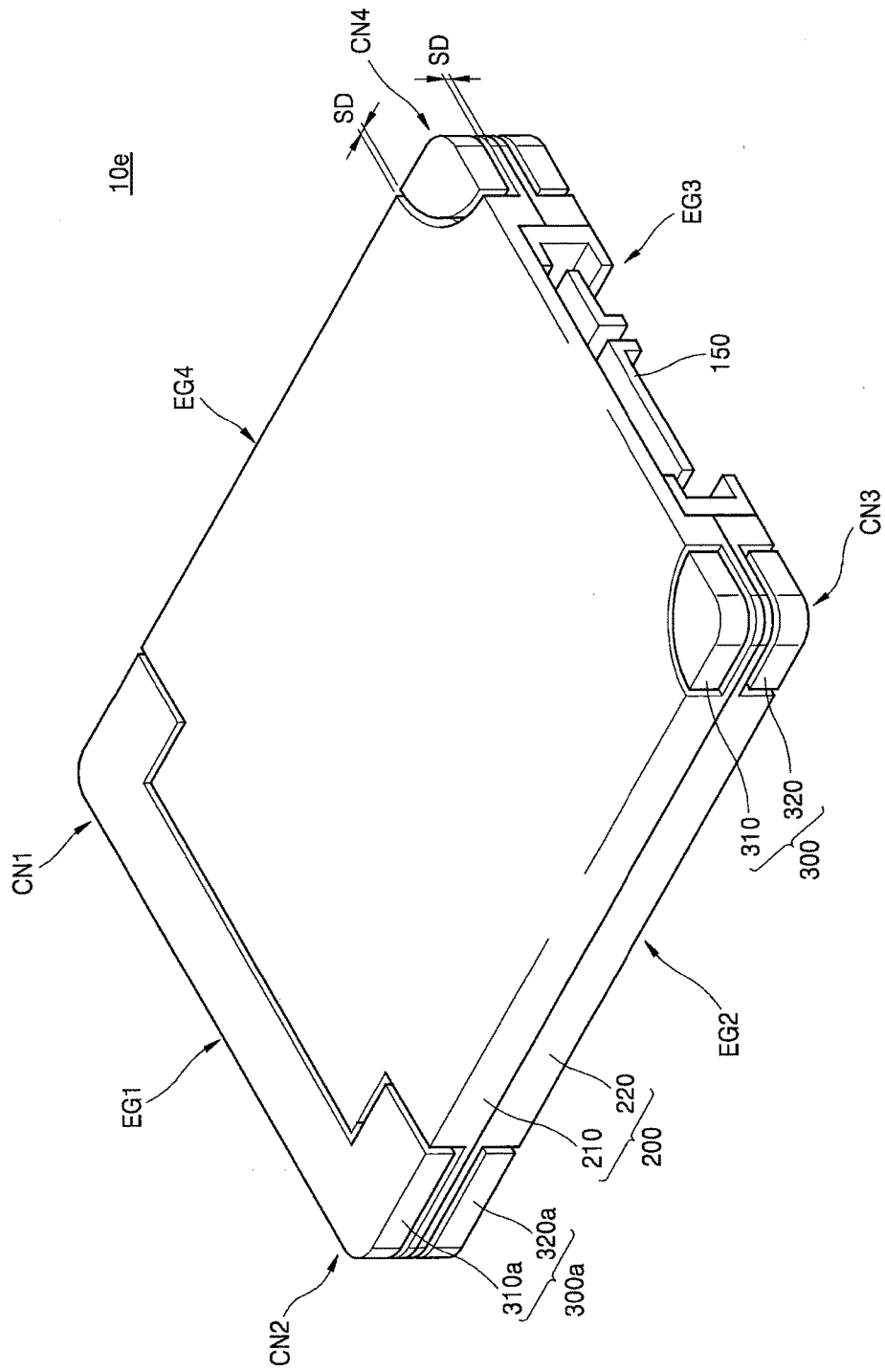

Referring to FIG. 6, the solid state drive apparatus 10e includes a first bumper case 300 mounted at some of the corners CN1, CN2, CN3, and CN4 of the main body case 200, here, at the corners CN3 and CN4, and a second bumper case 300a mounted at at least one of the sides EG1, EG2, EG3, and EG4, here at the side EG1.

The second bumper case 300a may have a U-shape when viewed from the exterior of the solid state drive apparatus 10e towards a major surface of the substrate 100 (FIG. 1B or FIG. 1C).

According to the solid state drive apparatuses 10d or 10e according to the exemplary embodiments, impact applied to the some corners CN3 and CN4 and the other corners CN1 and CN2 including the side EG1 is not transferred to the main body case 200, thereby preventing damages to inner portions of the solid state drive apparatus 10d or 10e.

Figure 7:
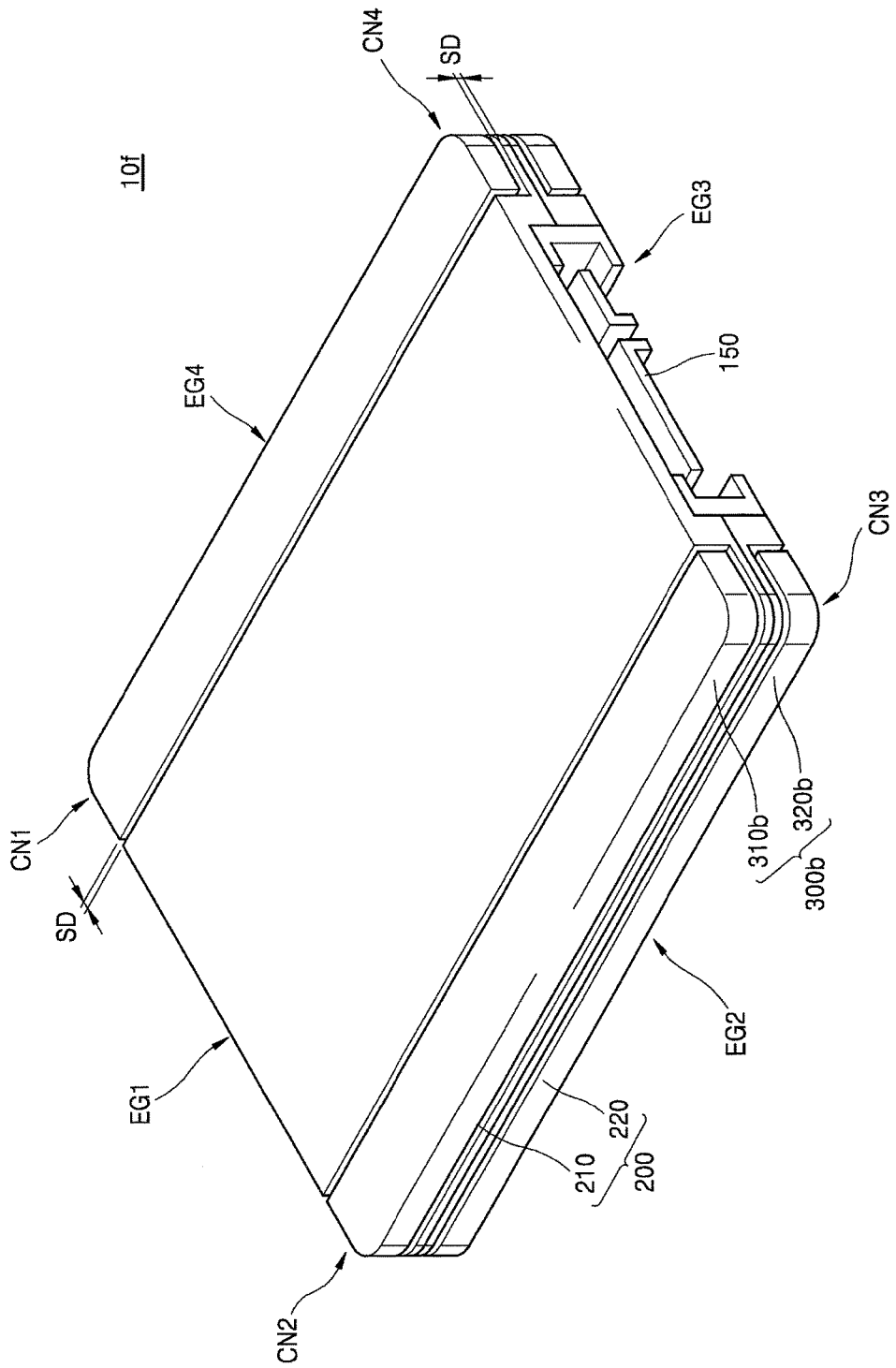

Referring to FIG. 7, the solid state drive apparatus 10f includes two bumper cases 300b mounted at two opposite sides among the sides EG1, EG2, EG3, and EG4 of the main body case 200, here, at the sides EG2 and EG4. The bumper cases 300b mounted at the sides EG2 and EG4 have the same shape as the second bumper case 300a of FIG. 5 mounted at the side EG1 described with reference to FIG. 5 except for a location where the bumper cases 300b are mounted, and thus a detailed description thereof will be omitted. The bumper cases 300b may each include an upper bumper case 310b and a lower bumper case 320b respectively mounted at the upper case 210 and the lower case 220.

The bumper case 300b may have a linear shape (or a bar-shape) when viewed from the exterior of the solid state drive apparatus 10f towards a major surface of the substrate 100 (FIG. 1B or FIG. 1C).

Figure 8:
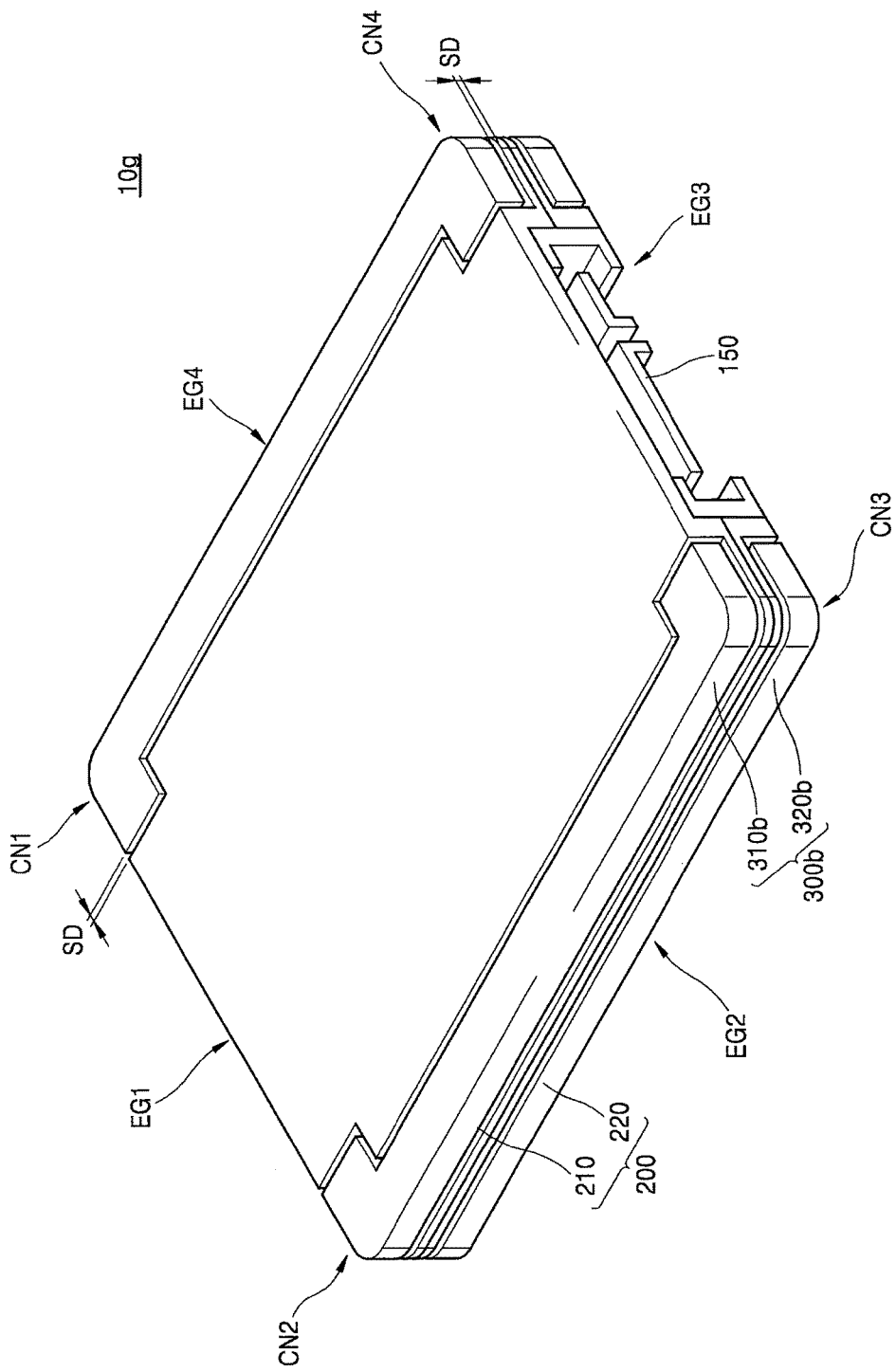

Referring to FIG. 8, the solid state drive apparatus 10g may include a bumper case 300b mounted at two opposite sides among the sides EG1, EG2, EG3, and EG4 of the main body case 200, here, at the sides EG2 and EG4.

The bumper case 300b may have a U-shape when viewed from the exterior of the solid state drive apparatus 10g towards a major surface of the substrate 100 (FIG. 1B or FIG. 1C).

According to the solid state drive apparatuses 10f or 10g according to the exemplary embodiments, impact applied to the corners CN1, CN2, CN3, and CN4 including the sides EG2 and EG4 is not transferred to the main body case 200, thereby preventing damages to inner portions of the solid state drive apparatus 10f or 10g.

FIG. 9A is a perspective view of a solid state drive apparatus 12 according to an exemplary embodiment of the inventive concept. Description provided above with reference to FIG. 1A and also applied to the embodiment of FIG. 9A may be omitted below.

Referring to FIG. 9A, the solid state drive apparatus 12 includes a bumper case 302 mounted at corners CN1, CN2, CN3, and CN4 of a main body case 200. The main body case 200 may include an upper case 210 and a lower case 220. The bumper case 302 may be mounted over the upper case 210 and the lower case 220.

That is, while the bumper case 300 illustrated in FIG. 1A is mounted separately at each of the upper case 210 and the lower case 220, the bumper case 302 may be mounted as a single unit over the entire main body case 200 including the upper case 210 and the lower case 220.

Figure 9B:
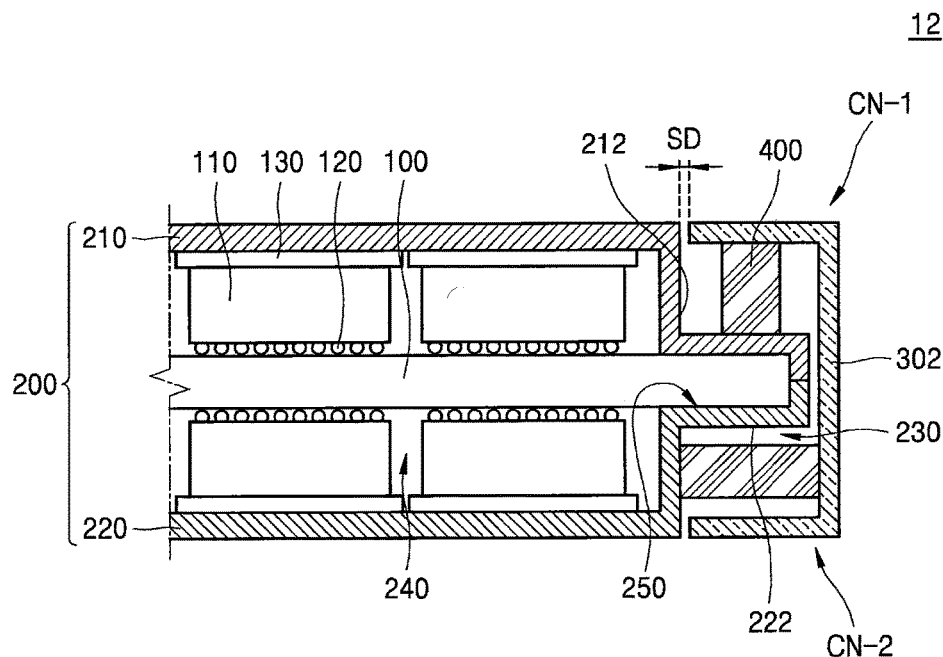
FIG. 9B is a cross-sectional view illustrating major portions of a solid state drive apparatus according to an exemplary embodiment of the inventive concept.

FIG. 9B is a cross-sectional view illustrating major portions of the solid state drive apparatus 12 according to an exemplary embodiment of the inventive concept. In detail, FIG. 9B is a cross-sectional view illustrating major portions of the solid state drive apparatus 12 at one of the corners CN1, CN2, CN3, and CN4 of the solid state drive apparatus 12 of FIG. 9A. Description provided above with reference to FIG. 1A and also applied to the embodiment of FIG. 9B may be omitted below.

When referring to FIGS. 9A and 9B, the solid state drive apparatus 12 includes a substrate 100, the main body case 200, in which the substrate 100 is mounted, the bumper case 302, and a shock-absorbing member 400.

The main body case 200 may include the upper case 210 and the lower case 220. The main body case 200 may include an accommodating portion 230 at each of the corners CN1, CN2, CN3, and CN4. The bumper case 302 may be mounted in the accommodating portion 230 of the main body case 200. The main body case 200 and the bumper case 302 may be connected to each other via the shock-absorbing member 400. The shock-absorbing member 400 may allow the main body case 200 and the bumper case 302 to have a separation distance SD therebetween.

The main body case 200 may include upper and lower depressed portions 212 and 222 that are bent from the exterior of the solid state drive apparatus 12 and have a groove shape. The main body case 200 may include the accommodating portion 230, in which the bumper case 302 is mounted via the upper and lower depressed portions 212 and 222.

The upper case 210 may include, at the corner CN1, the upper depressed portion 212 that is bent from the exterior of the solid state drive apparatus 12 and has a groove shape. The lower case 220 may include, at the corner CN2, the lower depressed portion 222 that is bent from the exterior of the solid state drive apparatus 12 and has a groove shape.

The main body case 200 may include the accommodating portion 230 in which the bumper case 302 is mounted over the upper depressed portion 212 of the upper case 210 and the lower depressed portion 222 of the lower case 220. The bumper case 302 may be connected to the upper case 210 and the lower case 220 via the shock-absorbing member 400.

The substrate 100 may be mounted in the main body case 200. The substrate 100 may be mounted in an internal accommodation space 240 and a substrate accommodation space 250 between the upper case 210 and the lower case 220. A portion of the substrate 100 may be inserted into the substrate accommodation space 250 formed between the upper depressed portion 212 and the lower depressed portion 222 and having a groove shape.

Figure 9C:
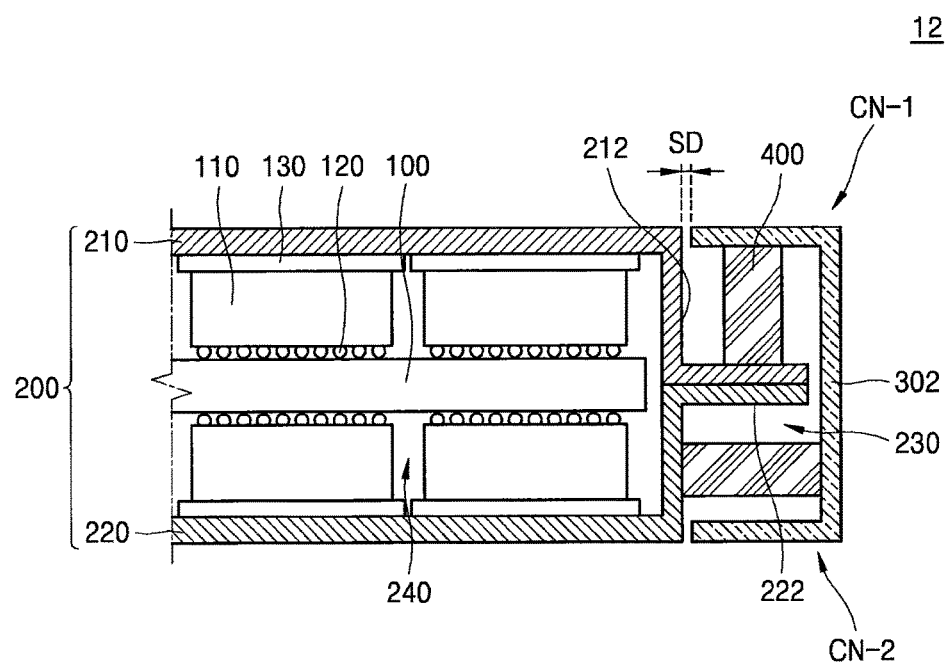
FIG. 9C is a cross-sectional view illustrating major portions of a solid state drive apparatus according to an exemplary embodiment of the inventive concept.

FIG. 9C is a cross-sectional view illustrating major portions of a solid state drive apparatus according to an exemplary embodiment of the inventive concept. In detail, FIG. 9C is a cross-sectional view illustrating major portions of the solid state drive apparatus 12 at one of the corners CN1, CN2, CN3, and CN4 of the solid state drive apparatus 12 of FIG. 9A. Description provided above with reference to FIG. 9B and also applied to the embodiment of FIG. 9C may be omitted below.

When referring to FIGS. 9A and 9C, the solid state drive apparatus 12 may include the substrate 100, the main body case 200, in which the substrate 100 is mounted, the bumper case 302, and the shock-absorbing member 400.

The substrate 100 may be mounted in the internal accommodation space 240 between the upper case 210 and the lower case 220. The upper depressed portion 212 and the lower depressed portion 222 may partially contact each other.

According to the solid state drive apparatus 12 illustrated in FIGS. 9A through 9C, as the bumper case 302 completely surrounds the corners of the solid state drive apparatus 12, impact applied to the bumper case 302 is not transferred to the main body case 200, and thus damages to inner portions of the solid state drive apparatus 12 may be prevented.

The bumper case 302 may have a rounded shape at the corners CN1, CN2, CN3, and CN4 of the solid state drive apparatus 12. The bumper case 302 may have an arc shape when viewed from the exterior of the solid state drive apparatus 12 towards a major surface of the substrate 100. In some exemplary embodiments, the arc-shaped corner portions may be rounded.

In addition, it will be obvious to one of ordinary skill in the art to form the bumper case 302 illustrated in FIGS. 9A through 9C by modifying the bumper cases 300 and 300b or the first and second bumper cases 300 and 300a illustrated in FIGS. 2 through 8, and thus detailed illustration and description thereof will be omitted.

FIGS. 10A through 10D are a perspective view and cross-sectional views illustrating a shock-absorbing member included in a solid state drive apparatus according to exemplary embodiments of the inventive concept. Shock-absorbing members 400a, 400b, 400c, and 400d illustrated in FIGS. 10A through 10D, and combinations thereof, may be the shock-absorbing member 400 illustrated in FIGS. 1A through 9C.

Figure 10A:
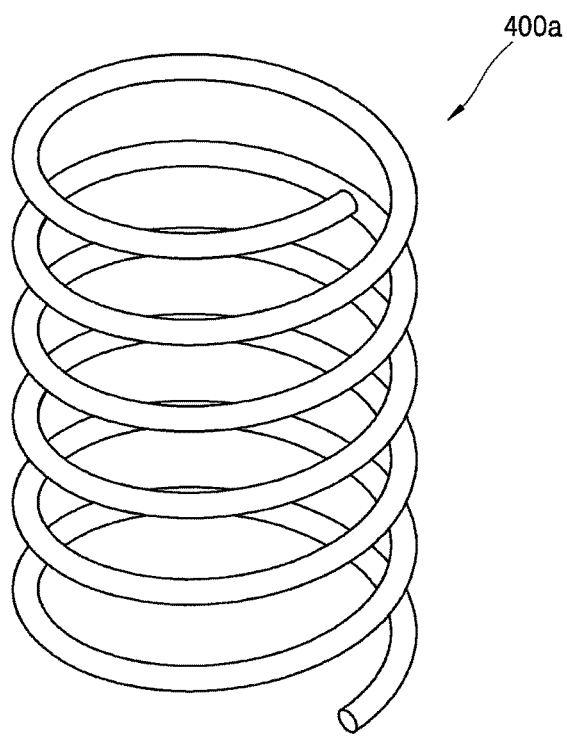
FIGS. 10A through 10D are a perspective view and cross-sectional views illustrating a shock-absorbing member included in a solid state drive apparatus according to exemplary embodiments of the inventive concept.

Referring to FIG. 10A, the shock-absorbing member 400a may be an elastic spring.

Figure 10B:
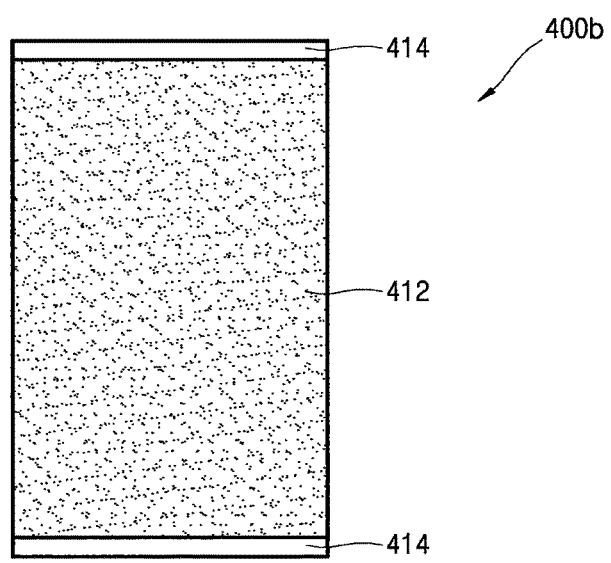

Referring to FIG. 10B, the shock-absorbing member 400b may be an elastic member. The shock-absorbing member 400b may include an elastic body 412 and an adhesive layer 414 attached to two ends of the elastic body 412. The elastic body 412 may be, for example, rubber or urethane, but is not limited thereto. When the elastic body 412 has adhesive properties, the adhesive layer 414 may be omitted.

Figure 10C:
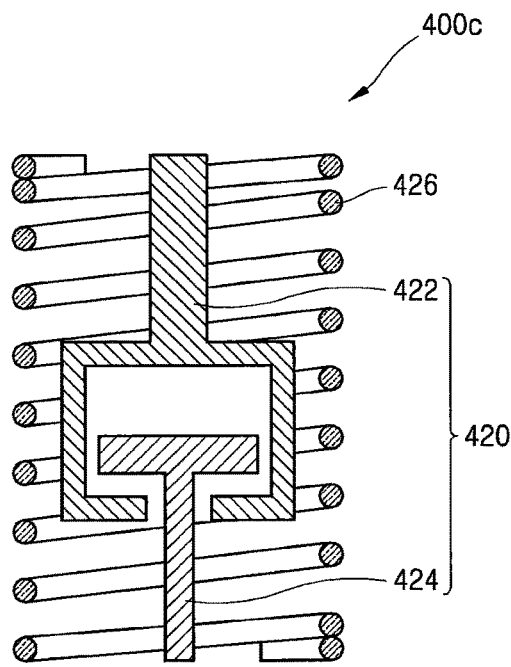

Referring to FIG. 10C, the shock-absorbing member 400c may include a stopper 420 and an elastic spring 426. The stopper 420 may include a first member 422 and a second member 424 that are coupled to each other so that the stopper 420 has a predetermined height or more. The elastic spring 426 may be coupled to the stopper 420 so as to prevent an abrupt increase in the height of the stopper 420.

Figure 10D:
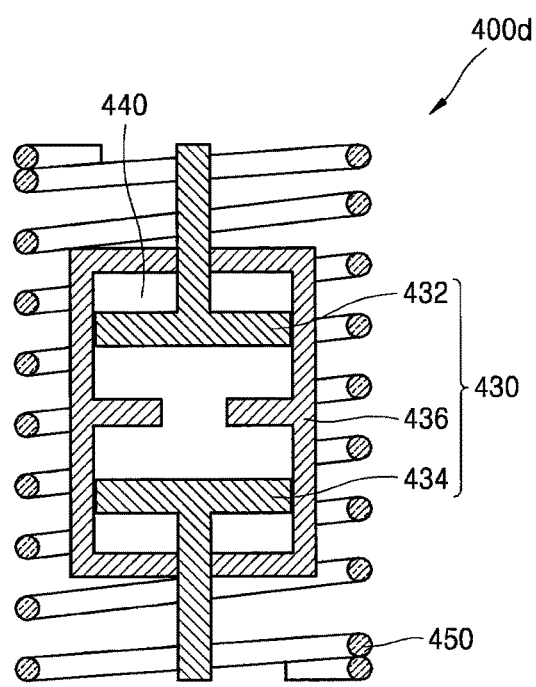

Referring to FIG. 10D, the shock-absorbing member 400d may include a damper 430. The damper 430 may include a first member 432, a second member 434, and a damper housing 436 surrounding portions of the first and second members 432 and 434. The damper housing 436 may be filled with a fluid 440. The fluid 440 may prevent an abrupt increase in a height of the damper 430. In addition, the shock-absorbing member 400d may further include an elastic spring 450.

Figure 11:
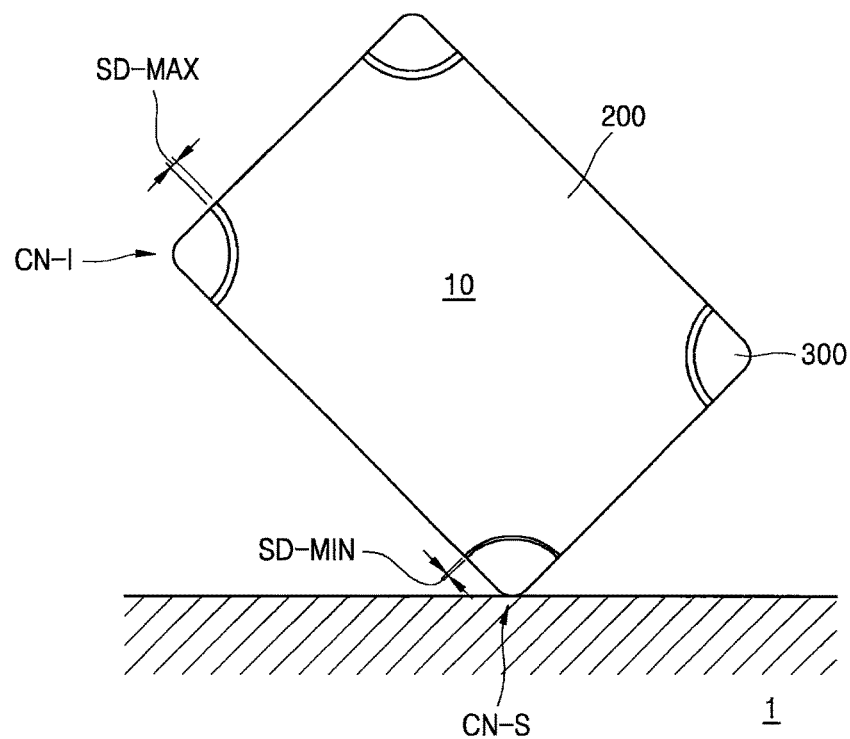
FIG. 11 is a view for explaining an operation of a bumper case included in a solid state drive apparatus according to an exemplary embodiment of the inventive concept.

FIG. 11 is a view for explaining an operation of a bumper case included in a solid state drive apparatus according to an exemplary embodiment of the inventive concept. FIG. 11 illustrates the solid state drive apparatus 10 of FIGS. 1A through 1C, but the solid state drive apparatus 10a, 10b, 10c, 10d, 10e, 10f, 10g, or 12 of FIGS. 2 through 9C may also operate in a similar manner, and thus illustration thereof will be omitted.

Referring to FIG. 11, when the solid state drive apparatus 10 contacts an impact surface 1 due to being dropped or a collision, one corner CN-S (hereinafter referred to as an impact corner) contacts the impact surface 1 due to the center of weight of the solid state drive apparatus 10 or the like, and impact is concentrated on the impact corner CN-S. Thus, if the bumper case 300 is not present, damage is caused to the impact corner CN-S, and inner portions of the solid state drive apparatus 10 may also be damaged accordingly.

However, according to the solid state drive apparatus 10 of the inventive concept, the bumper case 300 mounted at the impact corner CN-S absorbs the impact so that a separation distance SD-MIN of an allowable value is provided between the main body case 200 and the bumper case 300. Thus, as a distance between the bumper case 300 at the impact corner CN-S and the main body case 200 is being maintained so that the bumper case 300 does not directly contact the main body case 200, the impact applied to the bumper case 300 is not transferred to the main body case 200, thereby preventing damages to inner portions of the solid state drive apparatus 10.

The bumper case 300 at a corner CN-I to which no impact is applied maintains a maximum separation distance SD-MAX so that portions of the main body case 200 and bumper case 300 corresponding to each other are located on the same plane with the maximum separation distance SD-MAX therebetween and form the exterior of the solid state drive apparatus 10. The maximum separation distance SD-MAX denotes the separation distance SD of FIGS. 1A through 9C where no impact occurs.

Figure 12:
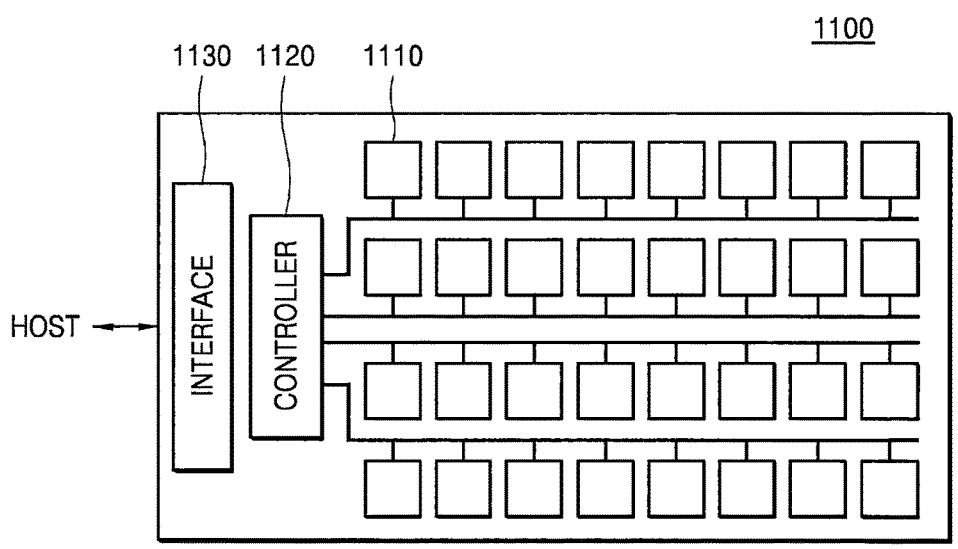
FIG. 12 is a structural diagram of a solid state drive apparatus according to exemplary embodiments of the inventive concept.

FIG. 12 is a structural diagram of a solid state drive apparatus 1100 according to exemplary embodiments of the inventive concept.

Referring to FIG. 12, the solid state drive apparatus 1100 includes a plurality of non-volatile memories 1110 and a controller 1120. The non-volatile memories 1120 may store data, and may have non-volatile characteristics of retaining stored data even if power supply is stopped. The solid state drive apparatus 1100 may be one of the solid state drive apparatuses 10, 10a, 10b, 10c, 10d, 10e, 10f, 10g, and 12 described with reference to FIGS. 1A through 11.

The controller 1120 may read data stored in the non-volatile memories 1110 or store data in the non-volatile memories 1110 in response to a request for reading or writing of a host HOST. An interface 1130 may transmit or receive a command and an address signal to or from the host HOST, and may again transmit or receive a command and an address signal to or from the non-volatile memories 1110 via the controller 1120.

The solid state drive apparatus 1100 may further include an active element or a passive element such as a resistor, a capacitor, inductance, a switch, a temperature sensor, a DC-DC converter, a quartz generating a clock, or a voltage regulator.

Figure 13:
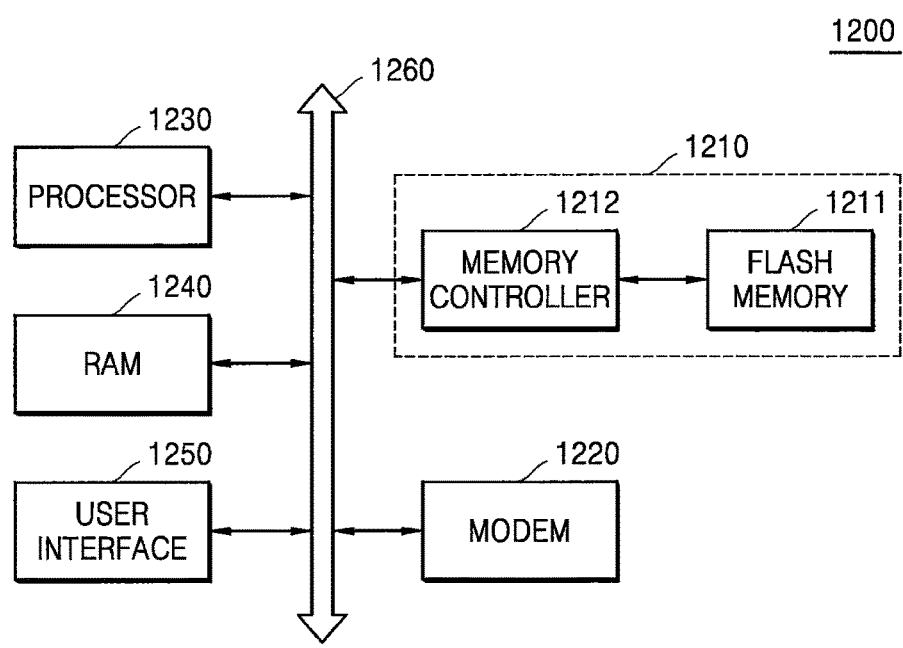
FIG. 13 is a block diagram of a system according to an exemplary embodiment of the inventive concept.

FIG. 13 is a block diagram of a system 1300 according to an exemplary embodiment of the inventive concept.

Referring to FIG. 13, the system 1200 may include a processor 1230 such as a CPU, a random access memory (RAM) 1240, a user interface 1250, and a modem 1220 that communicate with one another via a common bus 1260. The elements above may transmit or receive a signal to or from a storage device 1210 via a common bus 1260. The storage device 1210 may include a flash memory 1211 and a memory controller 1212. The flash memory 1211 may store data, and may have non-volatile characteristics of retaining stored data even if power supply is stopped. The storage device 1210 may be one of the solid state drive apparatuses 10, 10a, 10b, 10c, 10d, 10e, 10f, 10g, and 12 described with reference to FIGS. 1A through 11.

While the inventive concept has been particularly shown and described with reference to exemplary embodiments thereof, it will be understood that various changes in form and details may be made therein without departing from the spirit and scope of the following claims.

What is claimed is:

1. A solid state drive apparatus, comprising:
a substrate on which at least one non-volatile memory device is mounted;
a main body case in which the substrate is mounted, wherein an accommodating portion is formed at a corner of the main body case;
a bumper case mounted in the accommodating portion; and
a pair of shock-absorbing members connecting the main body case and the bumper case to each other such that a separation distance is provided between the main body case and the bumper case, wherein a first one of the pair of shock-absorbing members has a first orientation, and a second one of the pair of shock-absorbing members has a second orientation that is different from the first orientation,
wherein the main body case and the bumper case form an exterior of the solid state drive apparatus, and wherein adjacent portions of the main body case and the bumper case are substantially co-planar.

2. The solid state drive apparatus of claim 1, wherein the main body case comprises an upper case and a lower case, wherein the upper case comprises an upper depressed portion at the corner of the main body case, wherein the lower case comprises a lower depressed portion at the corner of the main body case, wherein the upper and lower depressed portions define the accommodating portion, and wherein the substrate is installed in an internal accommodation space between the upper case and the lower case.

3. The solid state drive apparatus of claim 2, wherein the bumper case comprises an upper bumper case mounted in the upper depressed portion and a lower bumper case mounted in the lower depressed portion.

4. The solid state drive apparatus of claim 2, wherein the bumper case is mounted in the accommodating portion over the upper and lower depressed portions.

5. The solid state drive apparatus of claim 1, wherein each of the pair of shock-absorbing members comprises at least one of an elastic member, a stopper, a damper, and an elastic spring.

6. The solid state drive apparatus of claim 1, wherein the bumper case is rounded at a corner of the exterior of the solid state drive apparatus.

7. The solid state drive apparatus of claim 1, wherein the bumper case has a triangular shape, a square shape, an arc shape or a L-shape.

8. The solid state drive apparatus of claim 1, wherein the accommodating portion is formed over two adjacent corners of the main body case and a side between the two corners.

9. The solid state drive apparatus of claim 8, wherein the bumper case has a linear shape or a U-shape.

10. The solid state drive apparatus of claim 1, wherein the main body case and the bumper case are formed of copper, aluminum, or stainless steel, or a clad metal including at least one of copper, aluminum, and stainless steel.

11. The solid state drive apparatus of claim 1, wherein the at least one non-volatile memory device and the main body case thermally contact each other via a thermal interface material (TIM).

12. A solid state drive apparatus, comprising:
a substrate in which at least one non-volatile memory device is mounted;
a main body case comprising an accommodation portion at each of four corners of the main body case, wherein the substrate is accommodated in the main body case;
a bumper case mounted in each accommodation portion; and
a respective pair of shock-absorbing members connecting the main body case and each bumper case, wherein each of the shock-absorbing members is configured to ensure that a separation distance between the main body case and a respective bumper case does not decrease beyond a set value when an impact is applied to the respective bumper case, wherein a first shock-absorbing member in each pair of shock-absorbing members has a first orientation, and wherein a second shock-absorbing member in each pair of shock-absorbing members has a second orientation that is different from the first orientation,
wherein adjacent portions of the main body case and each bumper case are substantially co-planar.

13. The solid state drive apparatus of claim 12, wherein the main body case comprises an upper case and a lower case, and wherein the substrate is accommodated in an internal accommodation space between the upper case and the lower case.

14. The solid state drive apparatus of claim 13, wherein the upper case comprises a depressed portion, wherein the lower case comprises a depressed portion, and wherein a portion of the substrate is inserted into a substrate accommodation space formed between the depressed portions of the upper case and the lower case.

15. A solid state drive apparatus, comprising:
a substrate on which at least one non-volatile memory device is mounted;
a main body case in which the substrate is mounted, wherein an accommodating portion is formed at a corner of the main body case;
a bumper case mounted in the accommodating portion; and
a pair of shock-absorbing members connecting the main body case and the bumper case to each other such that a separation distance is provided between the main body case and the bumper case, wherein a first one of the pair of shock-absorbing members has a first orientation, and a second one of the pair of shock-absorbing members has a second orientation that is different from the first orientation, and wherein the shock-absorbing members are configured to ensure that the separation distance does not decrease beyond a set value when an impact is applied to the bumper case.

16. The solid state drive apparatus of claim 15, wherein each one of the pair of shock-absorbing members comprises a device configured to restrict movement of the respective shock-absorbing member.

17. The solid state drive apparatus of claim 15, wherein each one of the pair of shock-absorbing members comprises at least one of an elastic member, a stopper, a damper, and an elastic spring.

* * * * *